US010033378B2

(12) United States Patent
Turvey

(10) Patent No.: US 10,033,378 B2
(45) Date of Patent: Jul. 24, 2018

(54) APPARATUS AND METHOD FOR SOLID STATE POWER CONTROL OF CURRENT LOAD

(71) Applicant: ROLLS-ROYCE PLC, London (GB)

(72) Inventor: Simon Turvey, Birmingham (GB)

(73) Assignee: ROLLS-ROYCE PLC, London (GB)

( * ) Notice: Subject to any disclaimer, the term of this patent is extended or adjusted under 35 U.S.C. 154(b) by 0 days.

(21) Appl. No.: 15/279,218

(22) Filed: Sep. 28, 2016

(65) Prior Publication Data
US 2017/0179946 A1 Jun. 22, 2017

(30) Foreign Application Priority Data

Dec. 22, 2015 (GB) .................................. 1522651.7

(51) Int. Cl.
H03K 3/00 (2006.01)
H03K 17/567 (2006.01)
H02M 3/07 (2006.01)
H03K 5/08 (2006.01)

(52) U.S. Cl.
CPC ............ H03K 17/567 (2013.01); H02M 3/07 (2013.01); H03K 5/08 (2013.01)

(58) Field of Classification Search
CPC .......... H03K 17/567; H03K 5/08; H02M 3/07
See application file for complete search history.

(56) References Cited

U.S. PATENT DOCUMENTS

| 4,476,402 | A | * | 10/1984 | Best | H03K 3/313 |
| | | | | | 326/82 |
| 5,030,844 | A | * | 7/1991 | Li | H02H 9/001 |
| | | | | | 307/115 |
| 5,602,897 | A | * | 2/1997 | Kociecki | H05G 1/06 |
| | | | | | 378/101 |
| 5,610,507 | A | * | 3/1997 | Brittan | H03K 17/122 |
| | | | | | 323/272 |
| 7,230,587 | B2 | * | 6/2007 | Onozawa | G09G 3/296 |
| | | | | | 315/169.3 |
| 7,505,820 | B2 | | 3/2009 | Plivcic et al. | |
| 7,538,454 | B2 | | 5/2009 | Yu et al. | |
| 7,586,725 | B2 | | 9/2009 | DiVito et al. | |
| 7,598,625 | B2 | | 10/2009 | Yu et al. | |

(Continued)

FOREIGN PATENT DOCUMENTS

CN 204119030 U 1/2015
EP 0 502 715 A1 9/1992

(Continued)

OTHER PUBLICATIONS

Tournier et al., "SiC Current Limiting FETs (CLFs) for DC applications," Materials Science Forum, 2014, vols. 778-780, pp. 895-898.

(Continued)

Primary Examiner — Kenneth B Wells
(74) Attorney, Agent, or Firm — Oliff PLC

(57) ABSTRACT

A solid state power control apparatus includes: (a) at least one IGBT and at least one FET, for supplying current to a load, and (b) a current controller for shutting off the IGBT and FET. The current controller is arranged to start shut off of the IGBT before it starts shut off of the FET. Further, the current controller is arranged to reduce current flow prior to start of the turn off of the IGBT and FET.

16 Claims, 15 Drawing Sheets

(56) References Cited

U.S. PATENT DOCUMENTS

| | | | |
|---|---|---|---|
| 7,634,329 B2 | 12/2009 | Liu et al. | |
| 7,706,116 B2 | 4/2010 | Liu et al. | |
| 7,741,883 B2 | 6/2010 | Fuller et al. | |
| 7,869,178 B2 | 1/2011 | Gayowsky et al. | |
| 7,902,604 B2* | 3/2011 | Su | H01L 27/0255 |
| | | | 257/356 |
| 7,936,085 B2* | 5/2011 | Vandergrift | G01R 19/16576 |
| | | | 307/9.1 |
| 8,050,806 B2 | 11/2011 | Fuller et al. | |
| 8,059,378 B2 | 11/2011 | Liu et al. | |
| 8,148,848 B2 | 4/2012 | Rusan et al. | |
| 8,704,574 B2 | 4/2014 | Prabhuk et al. | |
| 8,716,997 B2 | 5/2014 | Rao et al. | |
| 8,847,656 B1 | 9/2014 | A et al. | |
| 8,861,162 B2 | 10/2014 | Fuller et al. | |
| 8,970,261 B2* | 3/2015 | Shiraishi | H01L 27/0617 |
| | | | 327/109 |
| 9,041,456 B2* | 5/2015 | Hasegawa | H03K 17/12 |
| | | | 327/108 |
| 9,197,056 B2 | 11/2015 | Liu et al. | |
| 2010/0302729 A1 | 12/2010 | Tegart et al. | |
| 2012/0057387 A1* | 3/2012 | Lai | H02M 7/797 |
| | | | 363/132 |
| 2013/0257177 A1* | 10/2013 | Jacobson | H02M 1/08 |
| | | | 307/115 |
| 2014/0029152 A1 | 1/2014 | Mazzola et al. | |

FOREIGN PATENT DOCUMENTS

| | | |
|---|---|---|
| GB | 2 277 215 A | 10/1994 |
| JP | S61-72411 A | 4/1986 |
| JP | H04-354156 A | 12/1992 |
| WO | 2016/014901 A1 | 1/2016 |

OTHER PUBLICATIONS

Sheth et al., "Paralleling of IGBT and MOSFET for High Power Applications," International Journal of Emerging Technology and Advanced Engineering, Dec. 2012, vol. 2, No. 12, pp. 222-228.

Westmoreland, Martin, "Development of a Fault Tolerant MOS Field Effect Power Semiconductor Switching Transistor," School of Engineering, University of Warwick, Dissertation submitted for the degree of Doctor of Philosophy, Jun. 2012.

* cited by examiner

APPARATUS AND METHOD FOR SOLID STATE POWER CONTROL OF CURRENT LOAD

FIELD OF THE INVENTION

The present invention relates to solid state power control (SSPC), to such apparatus and to a method of operating such apparatus. In particular it relates to solid state power control for aerospace gas turbine engines.

BACKGROUND

Aerospace gas turbine technology is moving towards increased electric actuation and control, which leads to a need for additional local power generation and distribution as well as engine mounted motor drives.

To mount power management functionality in a high vibration environment on engine typically requires a compact solid state solution. Such solutions have to date focused on large quantities of parallel devices to achieve the necessary current and voltage rating and flow under normal conditions; however the need to carry and interrupt 10× over current faults make these simple solutions problematic.

SUMMARY

The invention aims to address the current carrying capability of the power stage and the lower level switch timing and energy absorption associated with turn on and turn off events. A scalable SSPC technology may be provided to meet these needs and may use the least number of individual semiconductors whilst focusing on the strengths of each semi-conductor type. The invention may provide a compact higher current intelligent load management equipment.

In a first aspect, the present invention provides a solid state power control apparatus according to claim 1.

In a further aspect, the present invention provides a solid state power control method according to claim 11.

The apparatus includes:
(a) at least one IGBT and at least one FET, for supplying current supplied to a load,
(b) a current controller for shutting off the IGBT and FET, wherein the current controller is arranged to start shut off of the IGBT before it starts shut off of the FET.

In some embodiments, as insulated gate bipolar transistor (s) (IGBTs) are used to carry the high currents which are often associated with load faults, since these devices are themselves prone to failure if they attempt to switch these currents the fault current will be commutated to a field effect transistor (FET) based path to allow the IGBT to safely switch off before the FET based path is itself switched off in a controlled manner. The operation of this FET path may be augmented, e.g. in the highest power applications, by the use of Silicon Carbide CLD (Current Limiting Diodes) which can provide much larger energy absorption capability for the interruption of the highest levels of fault current. Added to this, the switching profile of the metal oxide semiconductor field effect transistor (MOSFET)/CLD-JFET (Junction field effect transistor) may feature soft switching to improve the performance of the SSPC when driving capacitive loads. The use of a MOSFET current path additionally helps minimise supply harmonics in AC applications.

The current controller may be arranged to start shut off of the FET after the shut off of the IGBT has finished. The current controller may be arranged to shut off the FET at a predetermined voltage or current decay rate.

The current controller may be arranged to start turn on of the IGBT after it starts turn on of the FET. The current controller may be arranged to start turn on of the IGBT after the turn on of the IGBT has finished.

The current controller may be arranged to turn on the FET at a predetermined voltage or current increase rate.

The apparatus may further include an over-current controller for shutting off the IGBT and FET when current greater than a predetermined threshold is detected. The over-current controller may be part of the current controller.

The FET may be arranged in parallel with the IGBT, so as to minimise the voltage drop in the power supplied to the load. The voltage drop may be less than 2V under normal load conditions.

The current controller may be arranged to reduce current flow prior to start of the turn off of the IGBT and FET. The apparatus may further include a CLD or SiC JFET operable, e.g. by the current controller, to reduce the current flow prior to shut off.

The apparatus may further include a voltage clamp to prevent avalanche of the FET, which may be a function of FET control or by independent means.

The method aspect of the invention is as follows:

A method of operating a solid state power control apparatus, the apparatus including: at least one IGBT and at least one FET, for supplying current to a load, the method including the steps of starting shut off of the IGBT before starting shut off of the FET.

The method may also include any or all of the following optional steps:
starting to shut off the FET after the shut off of the IGBT has finished.
shutting off the FET at a predetermined voltage or current decay rate.
starting to turn on the IGBT after starting turn on of the FET.
starting turn on of the IGBT after the turn on of the IGBT has finished.
turning on the FET at a predetermined voltage or current increase rate.
shutting off the IGBT and FET when current greater than a predetermined threshold is detected.
reducing current flow prior to start of the turn off of the IGBT and FET.
Use of current foldback in SiC JFET devices to reduce current flow prior to turn off of the MOSFET.

Embodiments of the invention aim to improve or maximise the utilisation of the semiconductors in both current carrying and fault clearing modes. Embodiments may also introduce the advantages of the silicon carbide JFET structure with its considerably enhanced safe operating area into the arena of solid state power control.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES

The invention is mostly targeted at higher power (300V DC and above) solid state power control applications where it tackles 3 key areas of operation.

The premise is that any given power semiconductor has what is known as "safe area of operation" which is characterised by the voltage across the device multiplied by the current through the device as a function of time which represents the physical ability of the semiconductor to transport the heat generated away from the junction and is therefore a function of the die area, thickness and thermal conductivity. By using appropriate devices in series or parallel with controlled turn on and turn off timing improves or maximises the device utilisation and significantly improved performance may be achieved.

Figure 1:
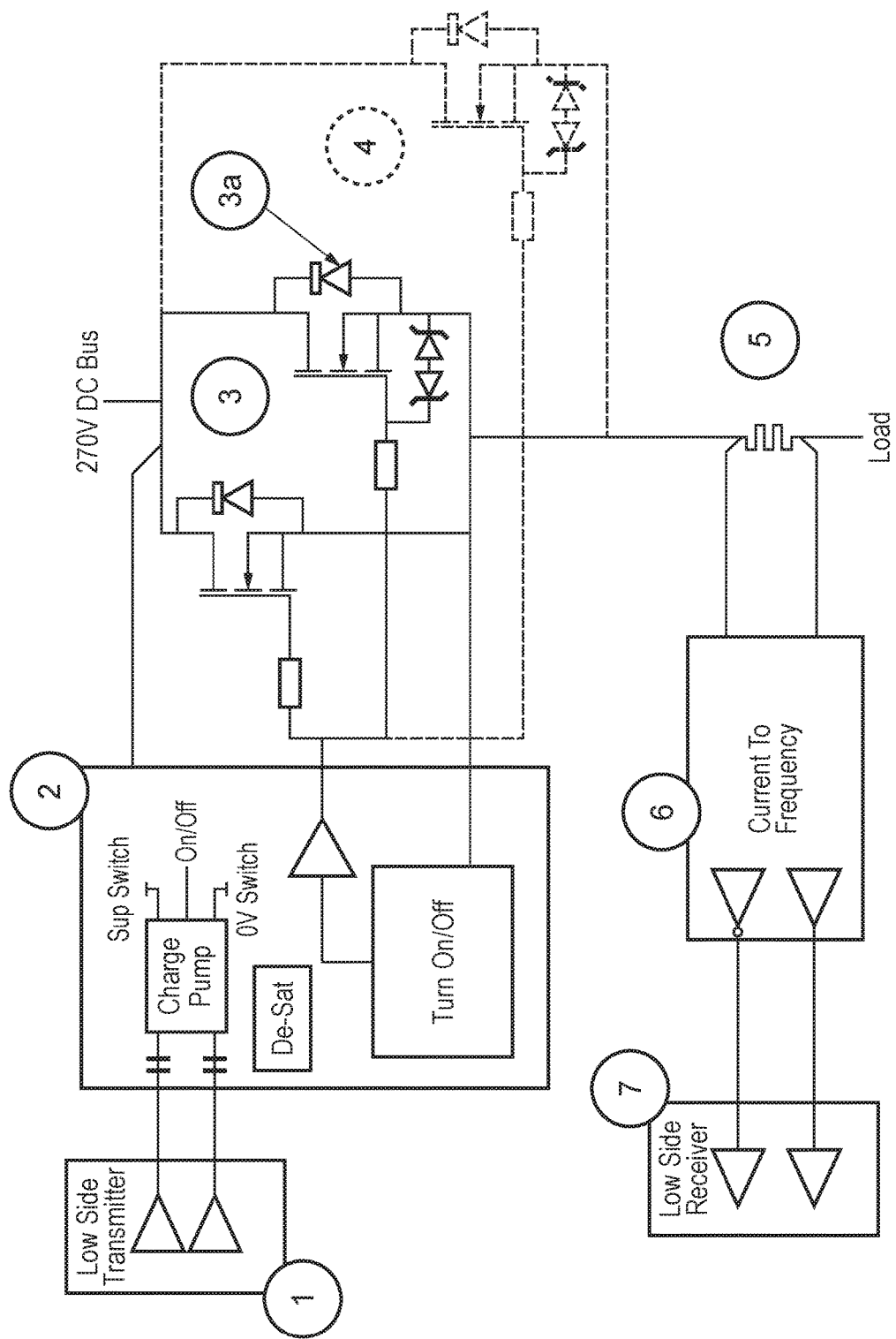
FIG. 1 shows a typical arrangement for an SSPC.

FIG. 1 shows a typical arrangement for an SSPC. Power stage block 1 is the driver stage driven by a ground referenced control function that provides a means of deriving power for a "floating" control function block 2 that is associated with the power switch. In one example, the power transfer mechanism is a differential charge pump but many other alternatives such as transformer or optical devices may be employed at the designer's discretion. The differential signal may carry an encoded signal to command the power switch thereby avoiding additional signalling circuitry. It may be the role of Block 2 to recover the encoded signal and/or recover adequate power for the "floating control", which might optionally include a maximum over current trip functionality independent of the main current signalling circuit, as well as or instead of gate driver functions for the main switches of Block 3. Block 3 is an IGBT and associated FET circuitry. One or more additional optional FET(s), represented by Block 4 may be added as necessary to meet overall current carrying requirements but such additions bring reduced returns since each doubling of the current rating requires twice as many switches.

The final blocks generally common to SSPCs are associated with indicating current flow to the low side control function. A typical instantiation of current sense resistor is shown as Block 5, which current controls a frequency generator, Block 6, and low side differential receiver Block 7. However many other options are possible including optical, transformer and hall-effect based methods.

A problem with the implementation shown in FIG. 1 is that the high speed operation of the power switch results in either excessive inrush currents to any capacitor load or possible voltage breakdown of the power switch due to energy stored in the load or wiring to the load. This turn off issue is exasperated by two more issues: first any energy stored in wiring is proportional to the square of the current; and second, with rapid turn off of the MOSFET the breakdown current flows in the parasitic diode Block 3a. So if a rupture capacity of 10× load current is required, the reactive energy is 100× that of normal operation. With the main MOS current channel turned off the reactive energy is concentrated in the parasitic diode block 3a which only has a fraction of the energy capability of the MOS structure.

Figure 2:
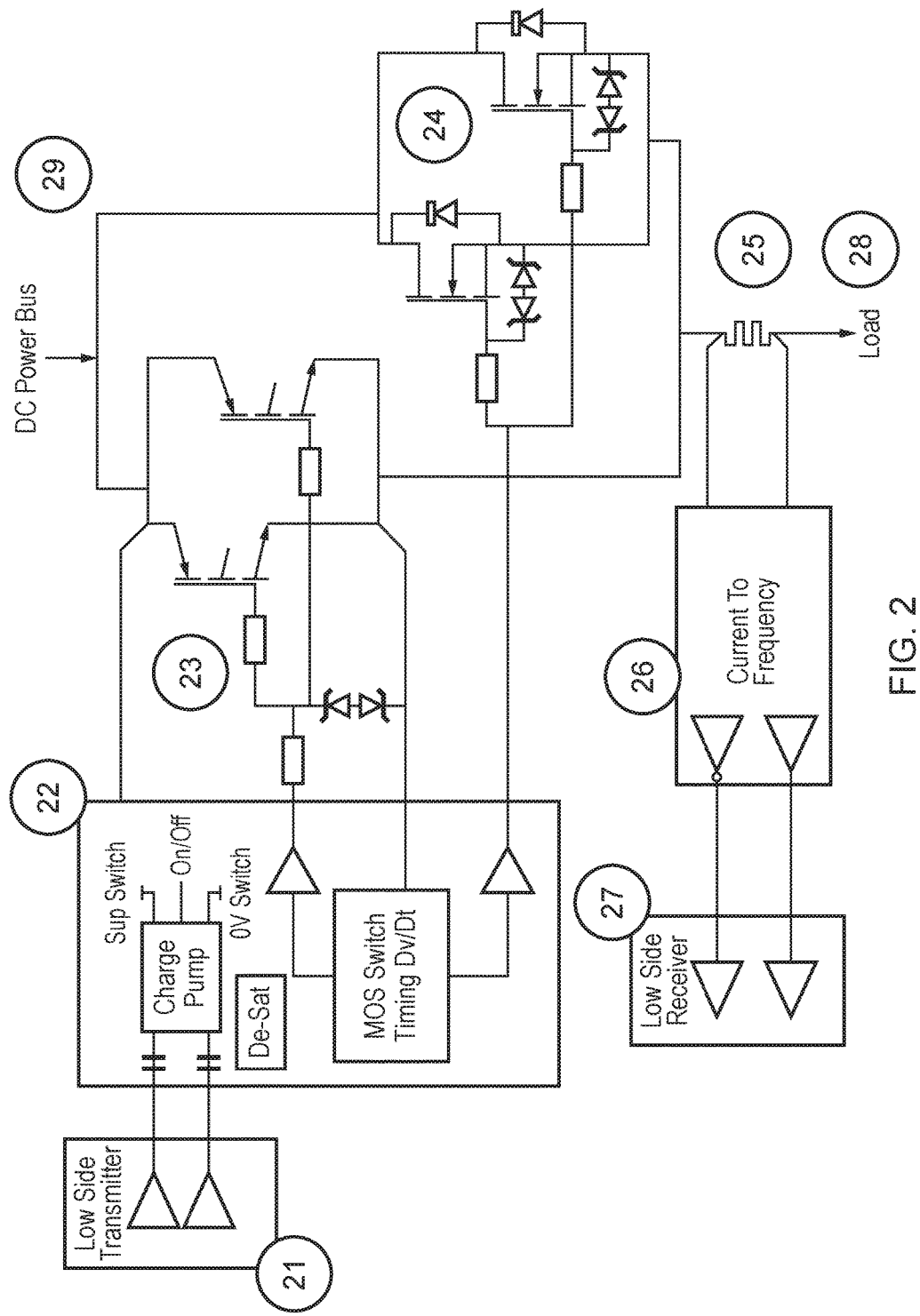
FIG. 2 shows an embodiment of the invention.

FIG. 2 shows an embodiment of the invention, whilst FIG. 3 shows the associated current flows in the embodiment from FIG. 2. It may be noted that although this embodiment does not include the use of silicon carbide JFET structures, this embodiment maximizes the effectiveness of silicon or silicon carbide MOS devices.

As with FIG. 1, Block 21 represents the ground referenced control driver function. Block 22 represents the floating switch control function and it is at this point that the first optional difference can be seen from the circuit of FIG. 1: rather than the parallel devices being driven from a single output, the high side control provides two outputs that can be used to control the on/off and Dv/Dt (or Di/Dt) timing of the two current paths through Block 23 and Block 24. In this embodiment, Block 24 represents a MOSFET based path with linear voltage drop with current; Block 23 represents an IGBT (MOS controlled Bi-Polar) current path that will limit the maximum voltage across the SSPC and therefore provide greater current carrying capacity for the SSPC than would be possible with the same area of MOSFET based die.

Figure 3A:
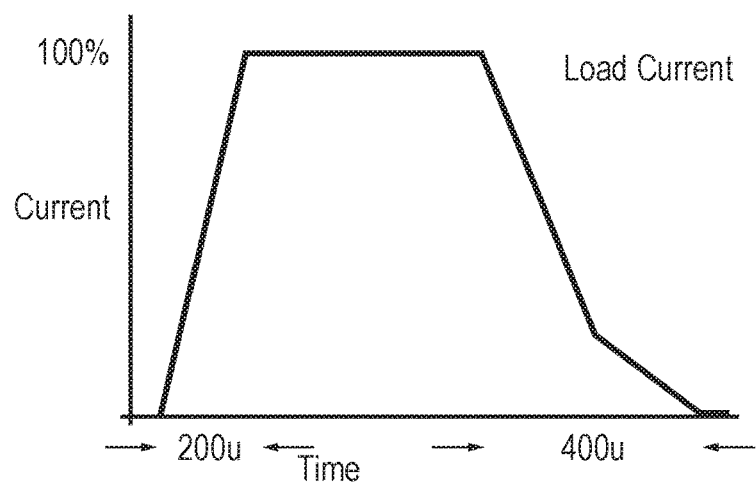
FIGS. 3*a* to 3*c* show the associated current flows in the embodiment of FIG. 2.
Figure 3B:
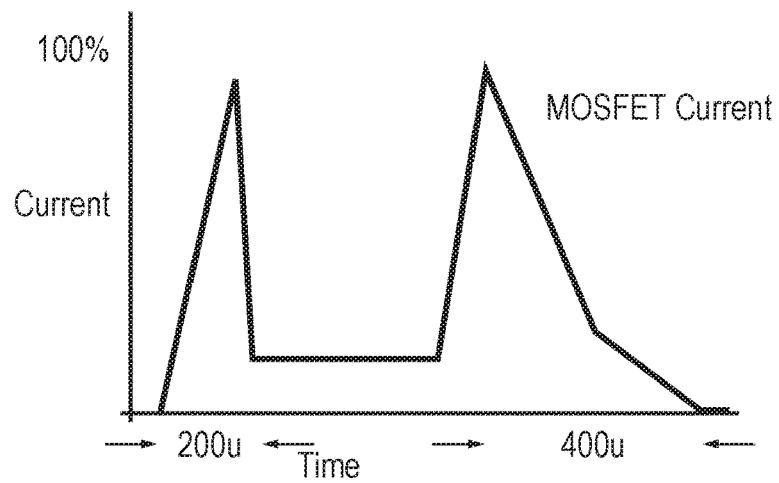
Figure 3C:
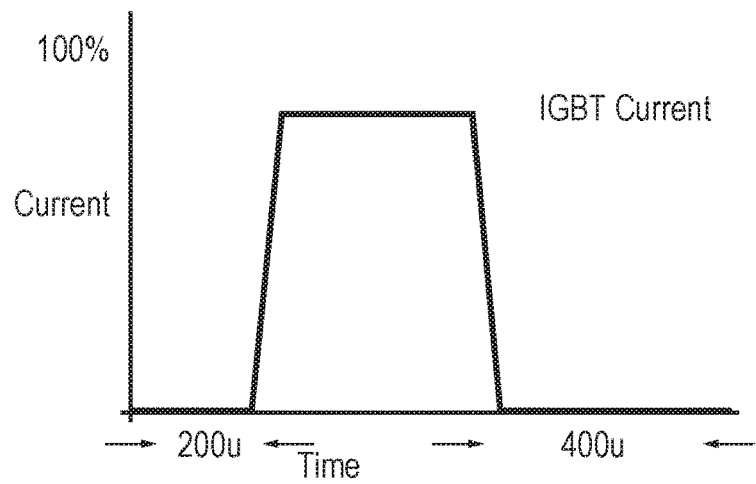

To demonstrate the operation of the switching operation of the SSPC, FIGS. 3a to 3c show the relative current flows in the current paths, starting with turn on at the left-hand side of the figure. FIG. 3a shows the load current, that is the current that flows from Block 29, the DC power bus, through the combined current paths. The load current is always the sum of the currents flowing in the MOSFET and IGBT paths, and out to the load via the current sensing function, Blocks 25-28. As in the corresponding section of FIG. 1, blocks 25-28 show a typical instantiation of current sense resistor as Block 25, which current controls a frequency generator, Block 26, and low side differential receiver Block 27. However many other options are possible including optical, transformer and hall-effect based methods. The current flows to a load shown as Block 28.

FIG. 3b shows the current flow in the MOSFET based path; it can be seen that this current rises first and at a controlled rate. This rate enables the SSPC to charge capacitive loads up to a defined maximum without exceeding the peak current of the SSPC or causing disruption to the power bus so enhancing overall power quality. Should the capacitance or load be excessive the floating control would normally terminate the turn on attempt leaving the higher level control functions to provide an intelligent response to a faulted load.

Once the voltage across the SSPC is reduced to the defined level, rapid turn on of the IGBT is initiated, as seen in FIG. 3c, and depending on the load current the two paths (IGBT and MOSFET) will share load current. It may be noted that limiting the current flow in the MOSFET(s) allows the devices to cool ready for turn off edge which will ultimately occur.

The right-hand side of the figures then show the turn-off sequence.

The first event is the rapid but controlled turn off of the IGBT, the timing of this turn off being dependent on the device characteristics and may allow enough time for charge diffusion in the IGBT structure. At this point in the cycle the MOSFET is now carrying the full load current, so the voltage across the IGBT does not rise to the full bus voltage further augmenting its current carrying potential under fault conditions. However, once the IGBT is turned off it is desirable that the MOSFET be turned off in a timely manner as represented by the turn off slope over nominally 400 us, although this time will be load and device dependent it must be within the safe operating area of the device.

Figure 4:
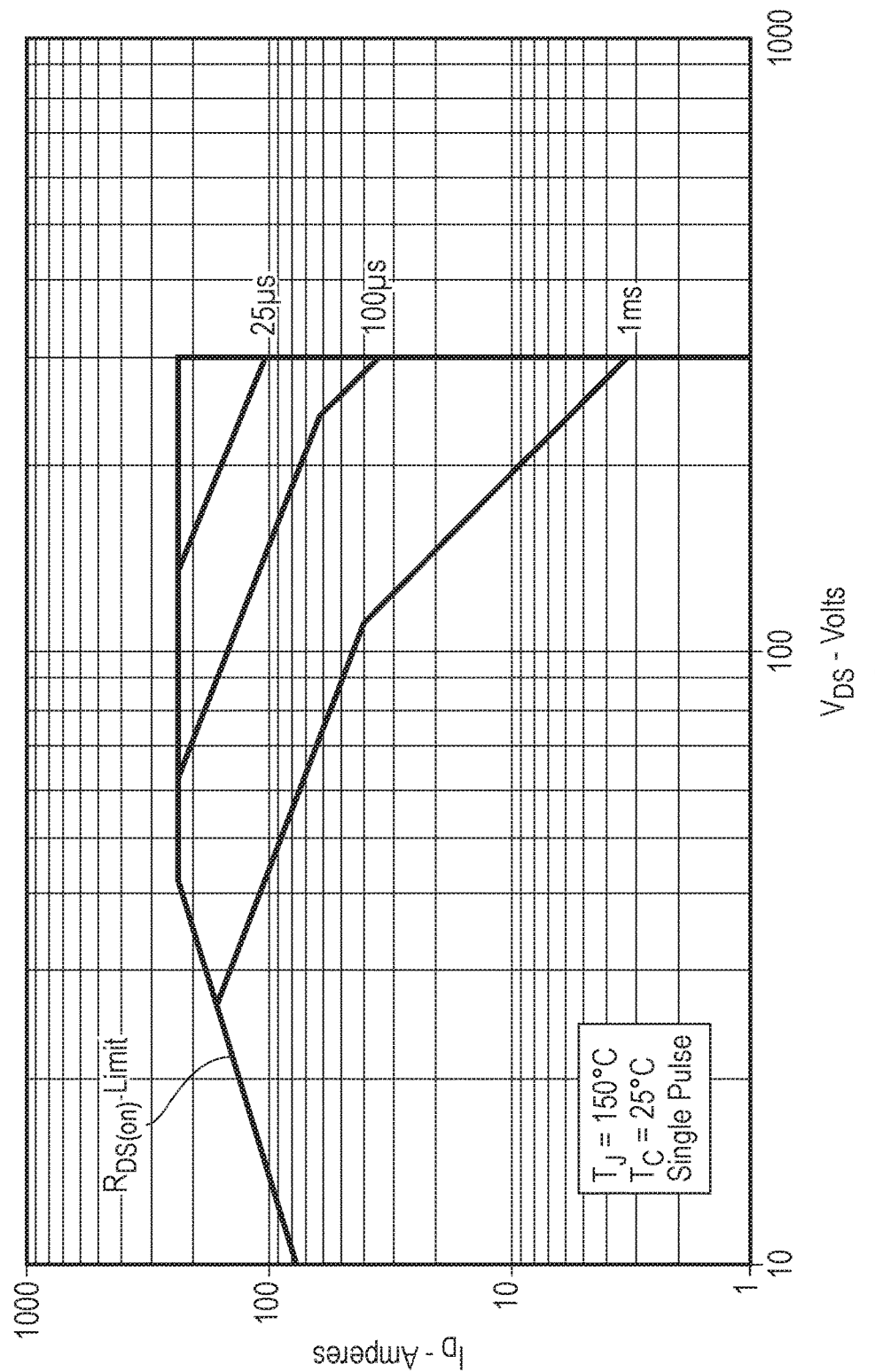
FIG. 4 shows a graph indicating the safe operating area of a MOSFET in linear mode.

It can be seen that the limiting factor in the design is now the safe operating area of MOSFET in linear mode, illustrated in FIG. 4. To overcome this limitation, the present invention may also allow the secondary current path through the MOSFETs to absorb more energy without exceeding the maximum junction temperature of silicon devices. One way of achieving this is to use a high temperature rated silicon carbide device.

Figure 5:
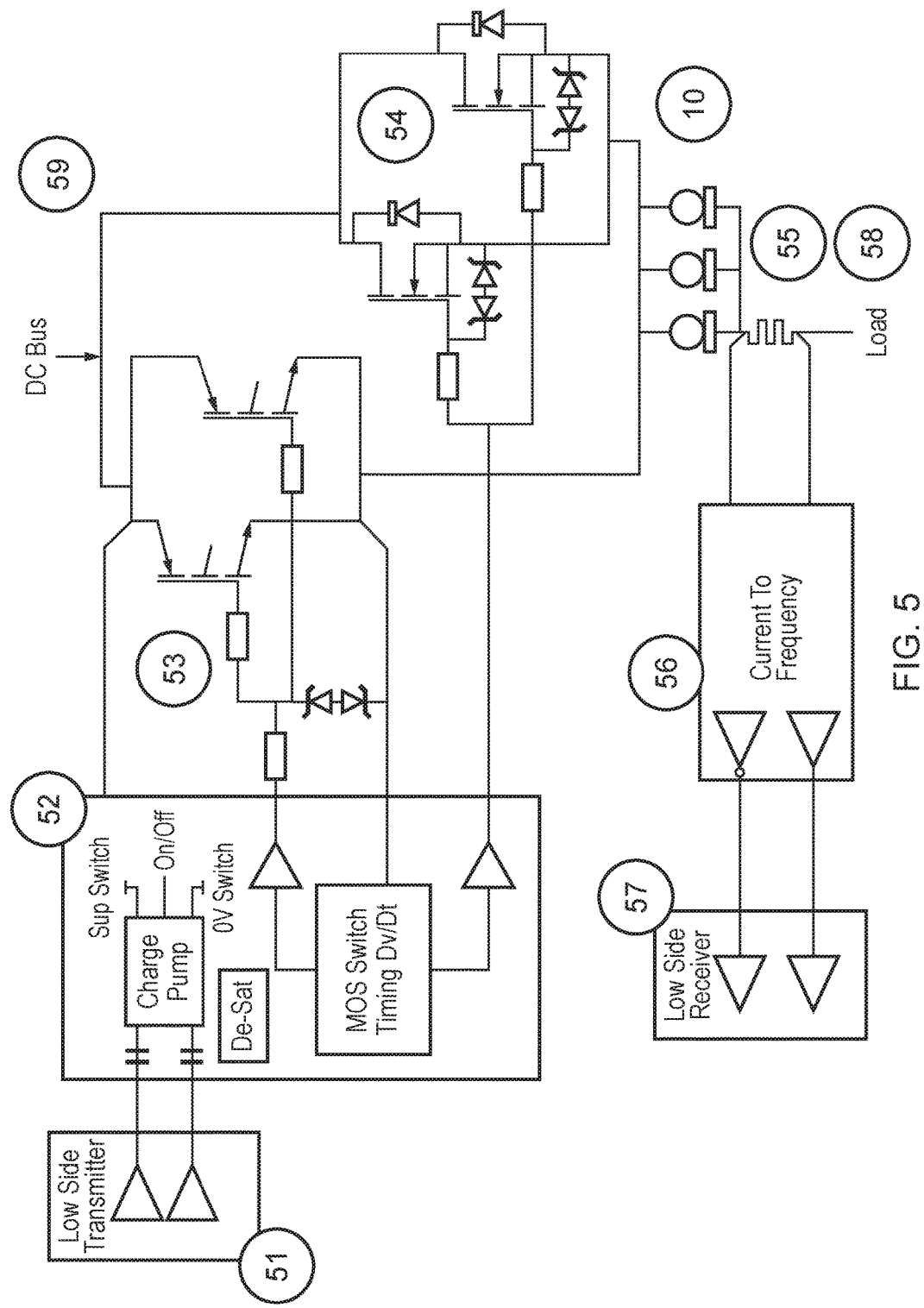
FIG. 5 shows a further embodiment of the invention, which includes silicon carbide JFET devices in a CLD format.

FIG. 5 shows an embodiment that includes silicon carbide JFET devices in a CLD format. Blocks 51 to 59 correspond to blocks 31 to 39 of FIG. 3. Block 10 is one or more silicon carbide JFET devices, to further augment the staged turn on and turn off concept of the SSPC. The advantageous feature of the CLD is that it makes use of two key physical features of the CLD; the first is the very large safe area of the device which is typically 3× that of a large MOSFET and the second is the relatively high temperature coefficient of silicon carbide devices, which is normally a negative feature, is in this case used to advantage to dynamically restrict the current flow as the device temperature rises.

Figure 6:
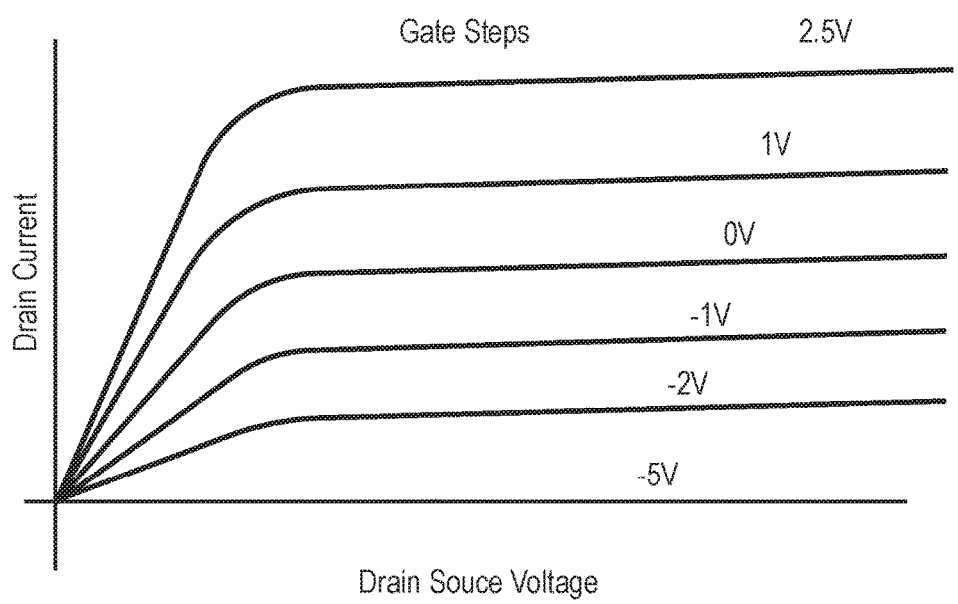
FIG. 6 shows a typical characteristic of a SiC CLD.
Figure 7:
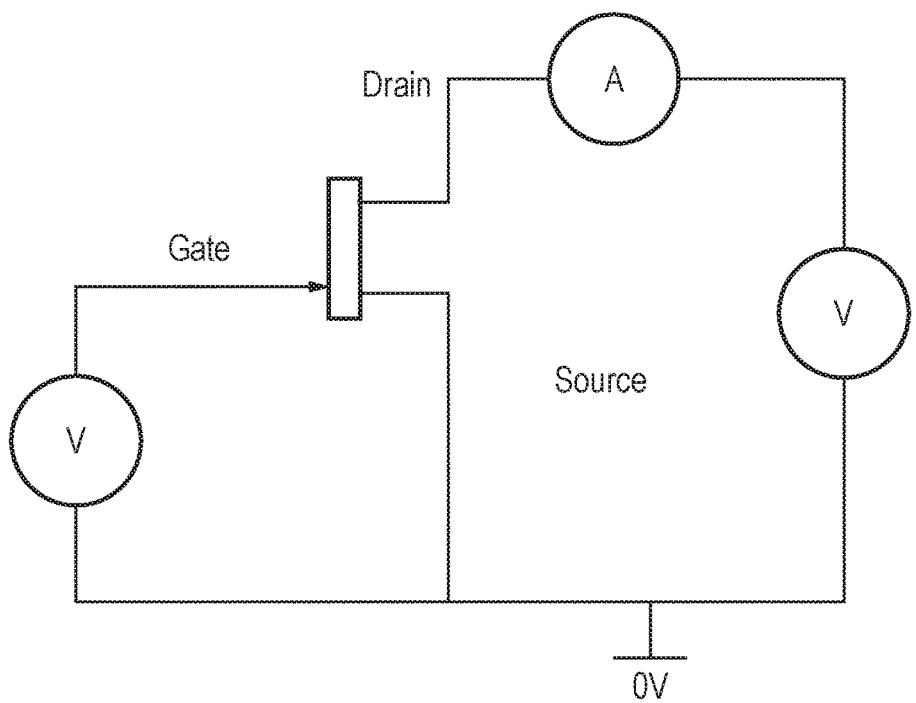
FIG. 7 shows a typical circuit for FIG. 6.

The SiC CLD is fundamentally a JFET structure and can be implemented in many ways FIG. 6 shows a typical characteristic; what can be seen is that there is no need to provide any control term in order to achieve a constant current flow from drain to source. Instead, it is simply necessary to connect the gate of the device to the source, as shown in FIG. 7; being a "normally on device", a "constant current" current characteristic is achieved. It can be seen however that the basic characteristic is perhaps not optimal, as the device resistance rises over that that would be achieved if a positive bias were applied to the gate, but with good device design this limitation can be minimised. Being constructed from silicon carbide brings all the advantage of the wideband gap semiconductor without the limitations imposed by the SiC MOS oxide issues; such as high temperature of operation, high voltage operation and tolerance to radiation damage. In our case it is the reduction in current flow that occurs under self-heating conditions that is key to this optional design with careful management of temperature rise.

Figure 8:
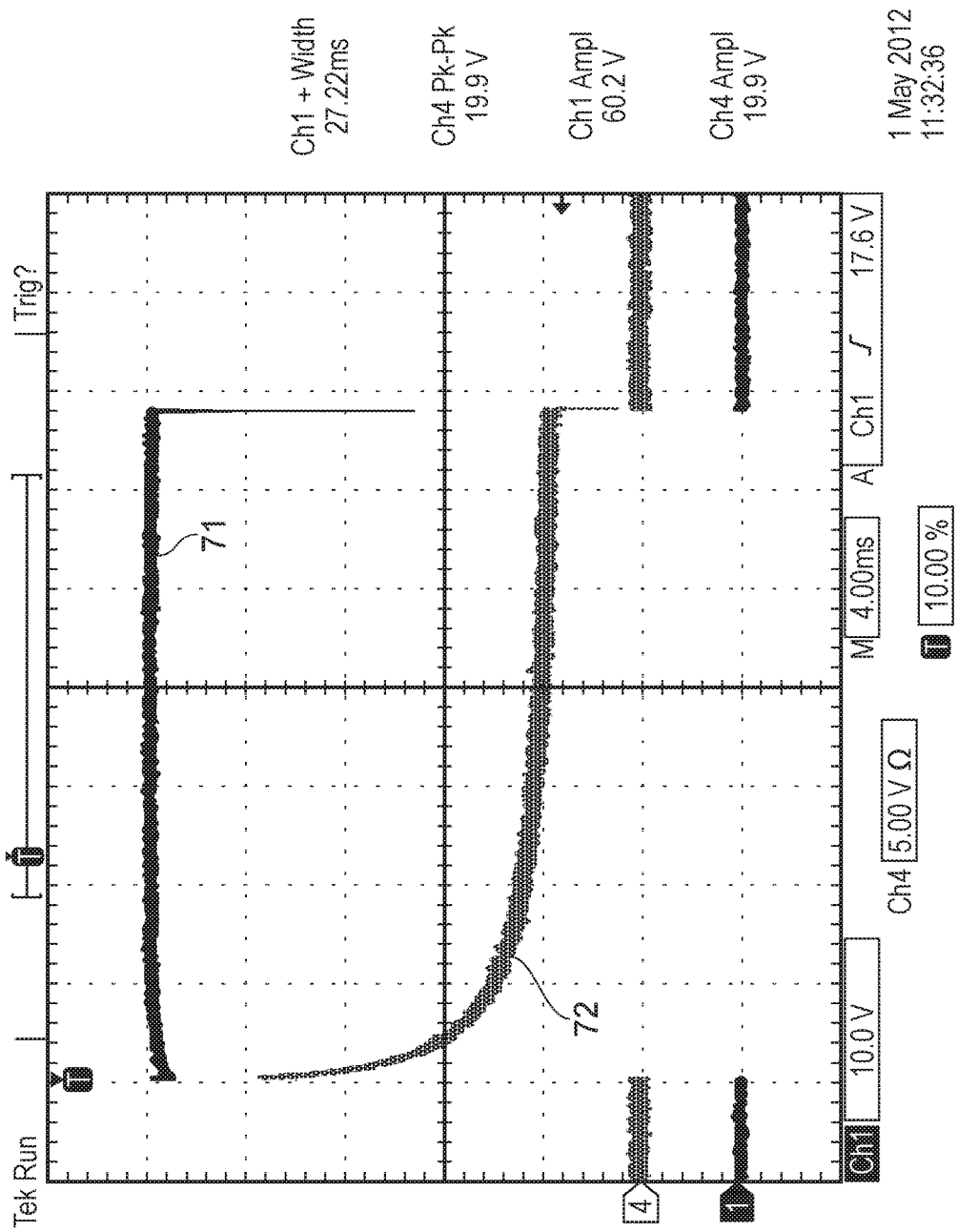
FIG. 8 shows a typical CLD characteristic under self-heating conditions.

FIG. 8 shows a typical CLD Characteristic under Self-Heating conditions. A low voltage 60V square pulse is labelled 71, with the device current labelled 72 peaking at 20 amps but falling rapidly due to self-heating. In the SSPC application the device or devices may be scaled for the maximum current flow and the MOSFET would be timed to turn off once the current/voltage was inside its operating region.

Presently SSPCs are expected to be normally off devices but an alternate embodiment of the CLD as an active JFET switch could be envisaged. If a negative gate voltage or normally on operation is available then the SiC JFET without the MOSFET switch would be advantageous. Further the SiC JFET device could be used in place of a CLD and an optimal positive bias applied to overcome the current limitation of 0V biasing. Preferentially such a voltage might be made dynamic over the switching operation to further improve the overall SSPC performance.

The invention is applicable to DC applications because there is no possibility of using zero voltage turn on and zero current turn off solutions. However, the basic premise of using semiconductors with optimal characteristics still applies and the reduction in current harmonic content possible using the combination of bi-polar and majority carried based devices could still be advantageous in AC applications.

Figure 9:
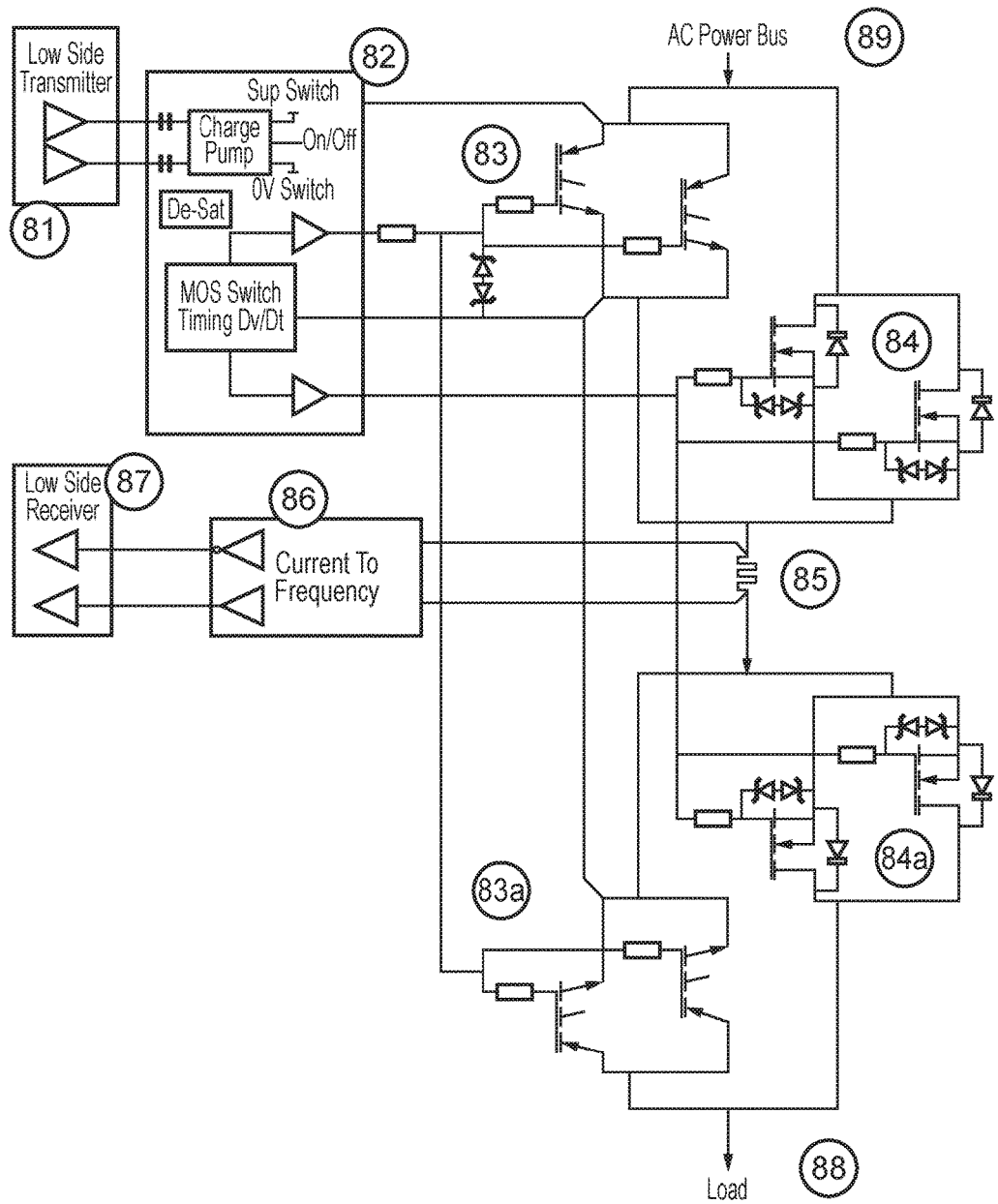
FIG. 9 shows an embodiment of the invention suitable for AC.

FIG. 9 shows an AC embodiment of the controlled turn on/off SSPC. Blocks 81 to 89 correspond to blocks 31 to 39 of FIG. 3.

As with the DC embodiment, it is desirable to create a low power control rail referenced to the power switch. In FIG. 9, Block 81 represents the 0V referenced drive circuit and Block 82 the floating control function. In this embodiment, a charge pump circuit with encoded On/Off data is shown, but as previously described, many ways of achieving this functionality are possible including transformer and optical methods.

Again as previously described the floating control function will provide timing to turn off the bi-polar path before turning the MOS and/or JFET path on or off in a Di/Dt or Dv/Dt manner. In this embodiment, the IGBT and MOSFET sections are doubled up, with blocks 83a and 84a respectively, to handle the AC cycle.

Current sensing is again shown as a resistive sensor, but this function too is open to variations including hall-effect, thermal and transformer based approaches. For the resistor based approach Block 86 provides a convenient encoding and isolation barrier with Block 87 providing a conditioning receiver but with self-isolating approaches such as the hall-effect and transformer based approaches Block 86 may be superfluous.

What would be desired in addition to the DC based control in Block 82 would be sensing of zero voltage and zero current crossing, so that these features could be incorporated into the turn On/Off algorithm. Ultimately the original Dv/Dt and Di/Dt algorithm from the DC SSPC embodiment is only required if the power stage is unable to carry the fault current for the necessary half cycle of the supply or the system is so demanding that an instantaneous trip characteristic is required. Note that for AC applications the bi-directional nature of the MOS channels and the effects of the parasitic diodes as current carrying elements as well as avalanche devices could be considered as part of the design and be incorporated into the timing and Dv/Dt and Di/Dt control.

Figure 10:
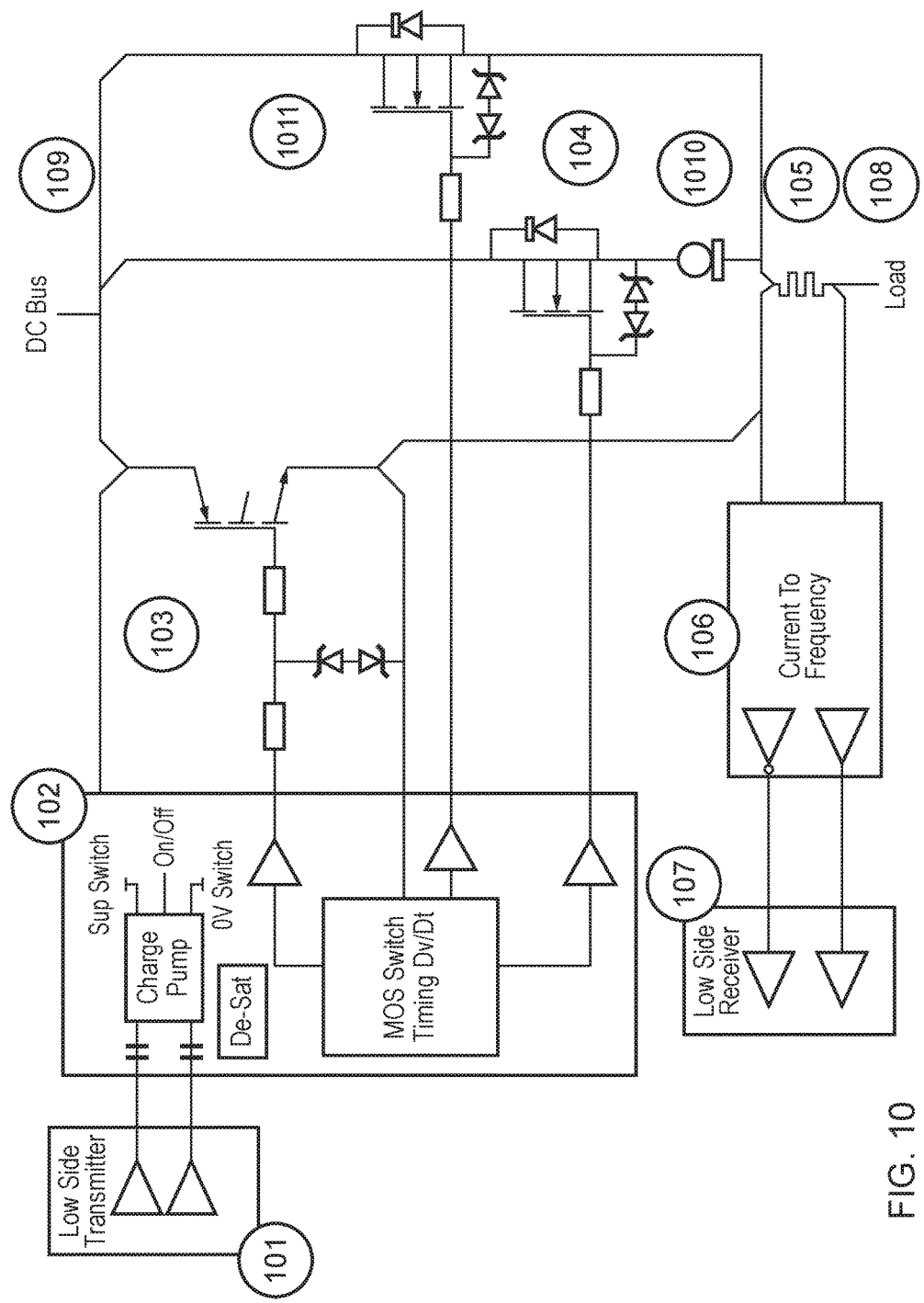
FIG. 10 shows an embodiment of the invention with three current paths.

In all the above embodiments it is assumed that the optimal performance can be achieved using only two current paths but in practice it may be more desirable to move to more current paths. FIG. 10 shows an embodiment with three current paths. Such a solution may be advantageous because providing the timing and Dv/Dt and Di/Dt control algorithm can be implemented in a simple form that does not outweigh the advantages of the approach. This approach can be utilised with any of the other embodiments described previously, and/or may be used with more than three current paths.

In the embodiment of FIG. 10, Block 101 provides the ground referenced control and power driver function. Block 102 shows the block that implements the turn on/off timing and the Di/Dt and Dv/Dt algorithms. Power flows into the SSPC through Block 109 and leaves the SSPC through Block 108 with Blocks 105, 106 and 107 providing current flow information to the low side control function. The additional feature in this embodiment is the three way current path that now allows the Bi-polar IGBT path in block 103 to be turned off before a low impedance MOS current path in Block 1011 and a current path with CLD, Blocks 104 and 1010 are used to achieve a final "safe" turn off. As previously described the very large safe area of the CLD will control the final current flow and allow for safe turn off of the series MOSFET Block 104.

Figure 11:
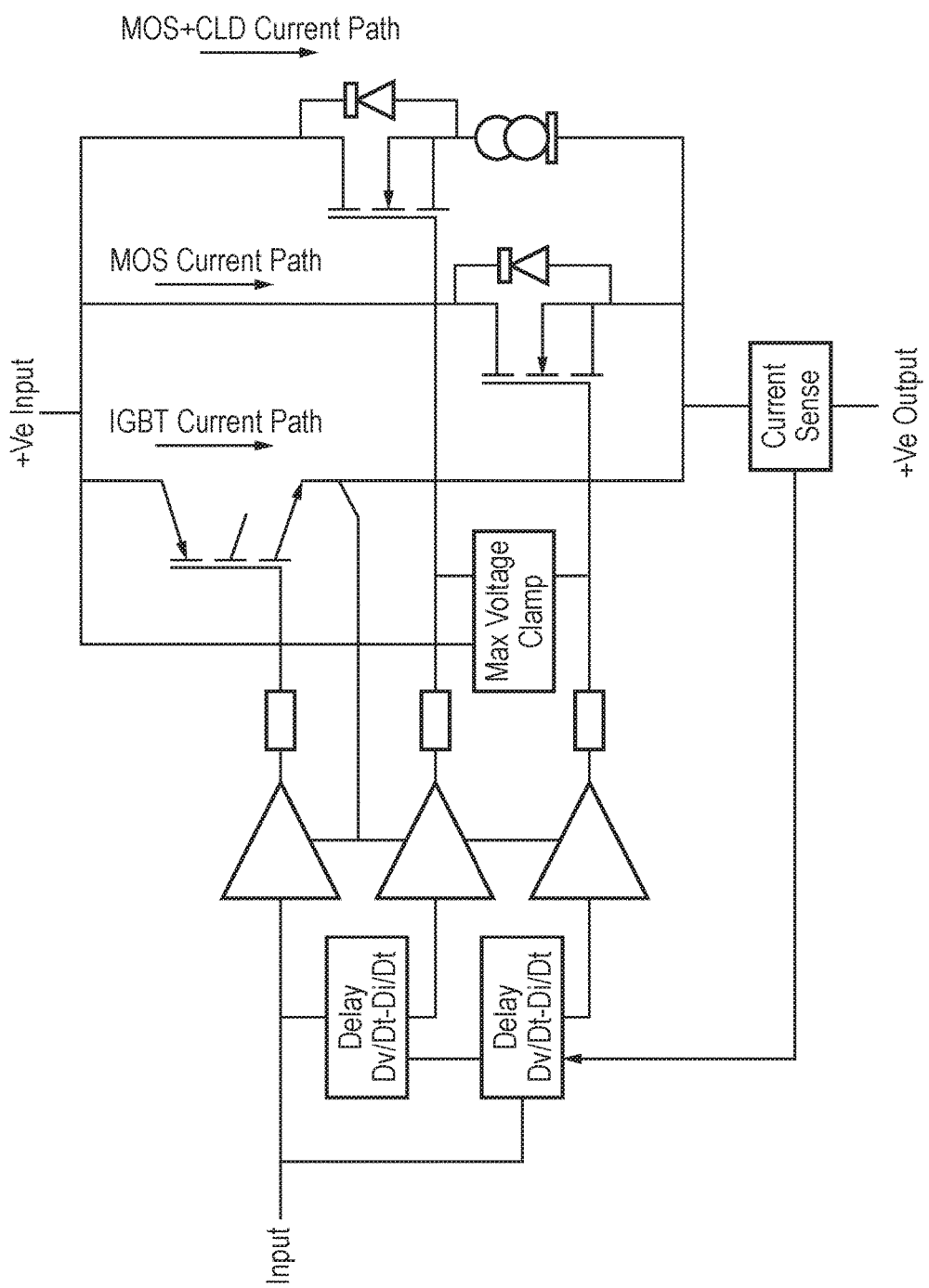
FIG. 11 shows a further embodiment of an SSPC according to the invention.

FIG. 11 is a circuit diagram of an example of an SSPC according to one embodiment of the invention. This diagram corresponds most closely to the embodiment of FIG. 10, but the principles illustrated apply to any of the other embodiments of the invention. Illustrated in FIG. 11 is part of the control function block 102, which controls the current flow through the IGBT(s) and the FET(s), together with (in this case) only one IGBT and two MOSFETS. However, as in other examples there may be more than one IGBT and/or a different number of FETs. An optional CLD is shown in series with one of the MOSFETS. In comparison with FIG. 10, FIG. 11 omits the various pairs of 5 back to back Zener diodes, as these are optional.

FIGS. 12 to 15 show flow charts illustrating different possible modes of operation of an SSPC according to the invention, together with graphs illustrating the respective current flows for each mode. These four illustrated modes are not exhaustive, and other switching scenarios could be envisaged. These particular scenarios are particularly advantageous for conserving the device thermal margin.

Figures 12A, 12B:
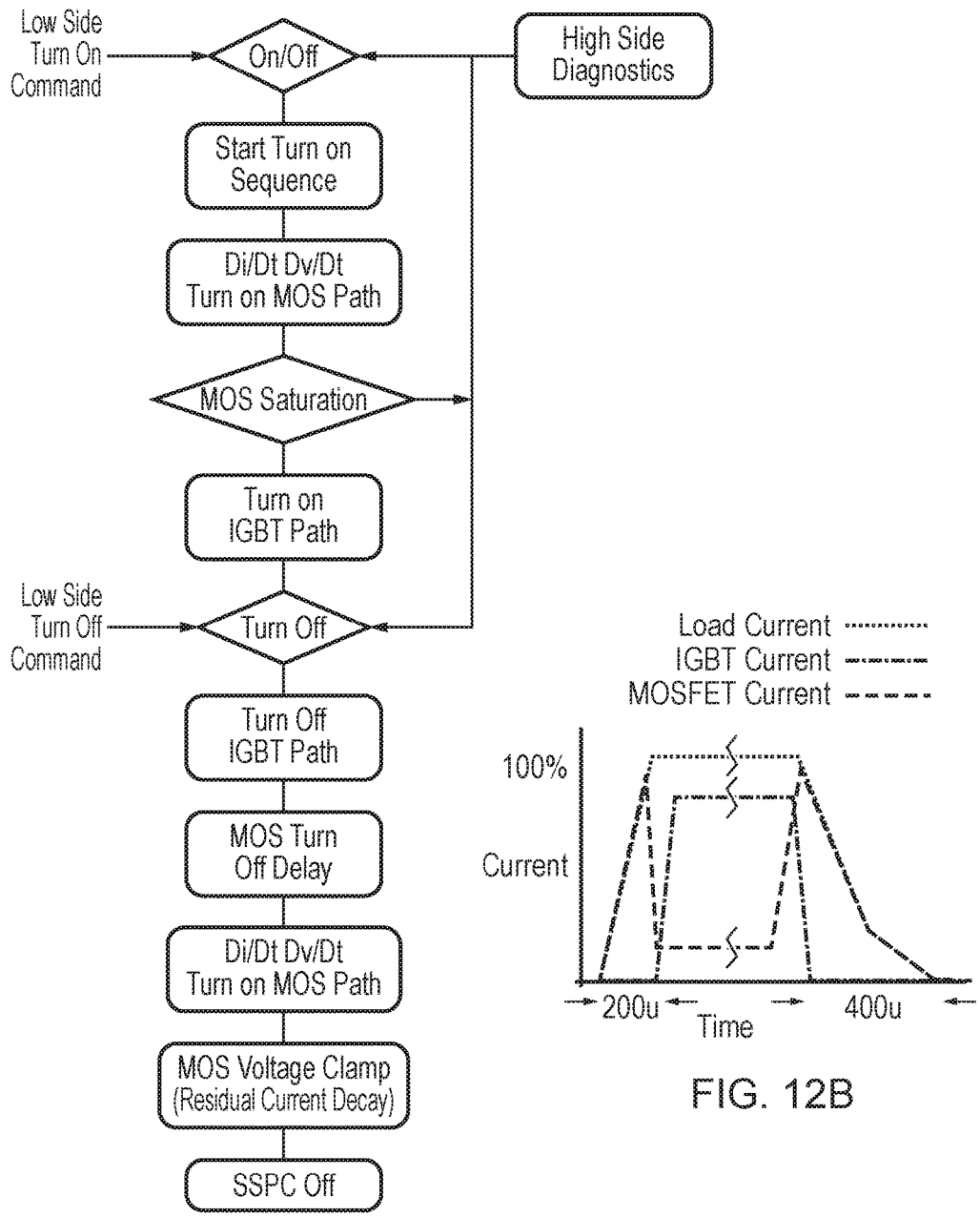
FIGS. 12A, 13A, 14A and 15A show flow charts of different possible modes of operation of the SSPC.
FIGS. 12B, 13B, 14B and 15B show graphs of the operation in accordance with the respective flow charts.

Briefly, the respective modes of operation (switching scenario) are as follows:

FIG. 12—MOSFET used for turn-on and turn-off cases with the IGBT carrying the majority of the current at 100% and above to conserve MOSFET thermal margin during switching.

Figures 13A, 13B:
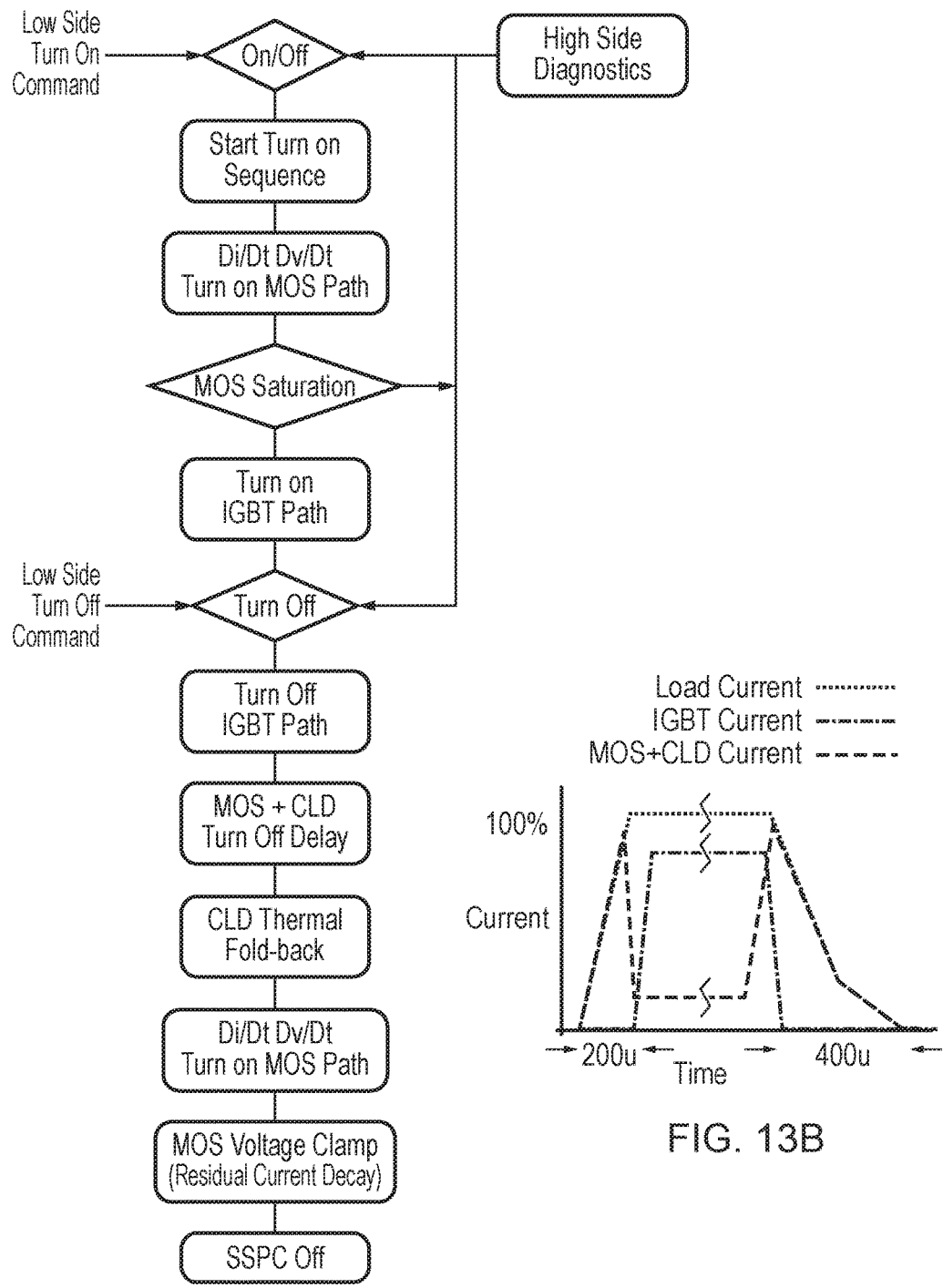

FIG. 13—MOSFET+CLD used for turn-on and turn-off cases with the IGBT carrying the majority of current at 100% and above to conserve MOSFET+CLD thermal margin during switching.

Figure 14A:
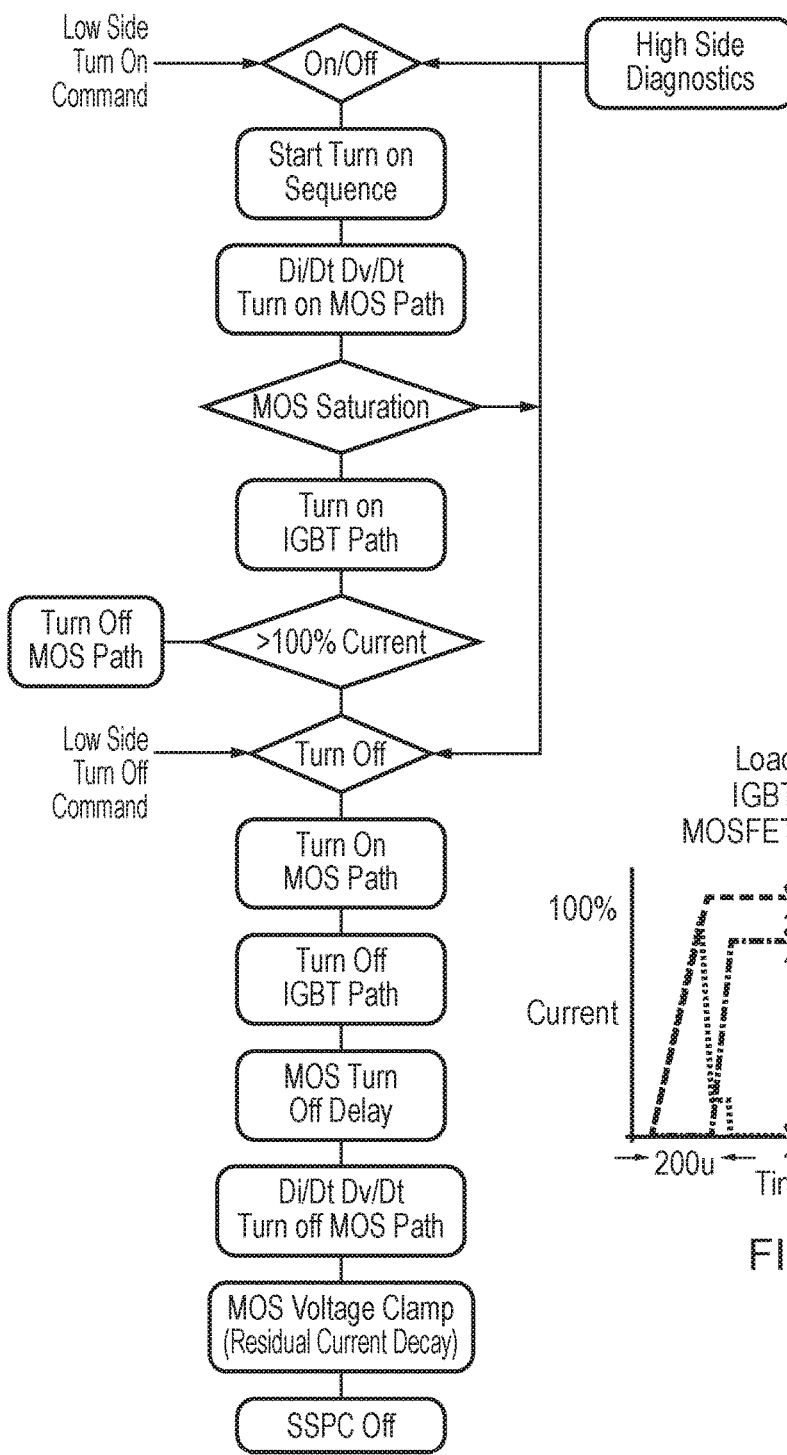
Figure 14B:
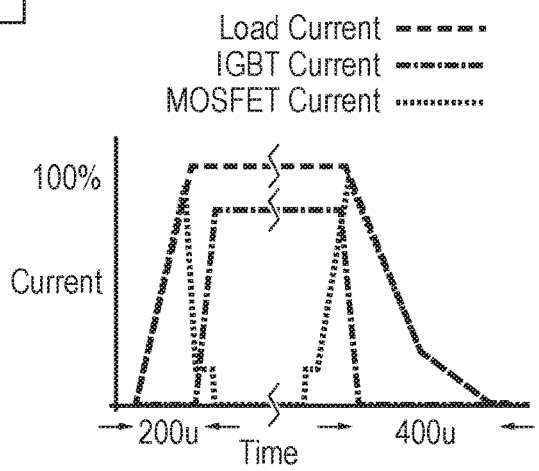

FIG. 14—MOSFET used for turn-on and turn-off cases with the IGBT carrying all the current at 100% and above to further conserve MOSFET thermal margin during switching.

Figures 15A, 15B:
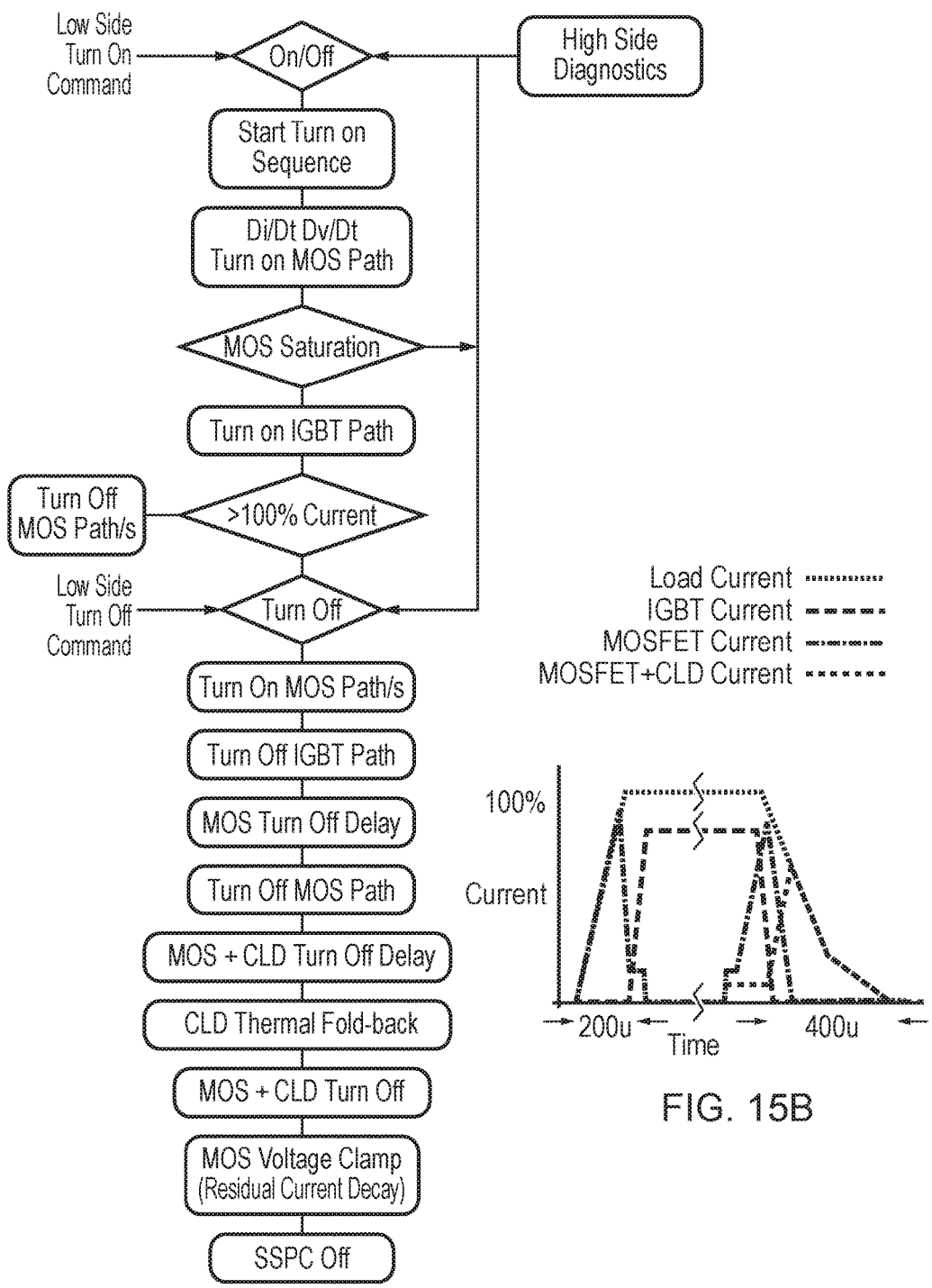

FIG. 15—MOSFET used for turn-on case with IGBT carrying all the current at 100% and above to further conserve MOSFET thermal margin, with the MOSFET+CLD augmented path used for final turn-off under the highest energy case.

The invention is advantageous in all application of industrial solid state power control. It offers the capability to reduce total silicon area and therefore cost and weight.

The preceding description provides preferred exemplary embodiment(s) only, and is not intended to limit the scope, applicability or configuration of the invention. Rather, the description of the preferred exemplary embodiment(s) will provide those skilled in the art with an enabling description for implementing a preferred exemplary embodiment of the invention, it being understood that various changes may be made in the function and arrangement of elements without departing from the scope of the invention.

Specific details are given in the preceding description to provide a thorough understanding of the embodiments. However, it will be understood by one of ordinary skill in the art that embodiments maybe practiced without these specific details. For example, well-known circuits, processes, algorithms, structures, and techniques may be shown without unnecessary detail in order to avoid obscuring the embodiments.

Also, it is noted that embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium such as storage medium. A processor(s) may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

What is claimed is:

1. A solid state power control apparatus comprising:
at least one IGBT and at least one FET, for supplying current to a load,
a current controller for shutting off the IGBT and FET, wherein the current controller is arranged to start shut off of the IGBT before it starts shut off of the FET; and
a CLD or SiC JFET operable by the current controller to reduce the current flow prior to shut off,
wherein the current controller is arranged to reduce current flow prior to start of the turn off of the IGBT and the FET.

2. The apparatus according to claim 1, wherein the current controller is arranged to start shut off of the FET after the shut off of the IGBT has finished.

3. The apparatus according to claim 1, wherein the current controller is arranged to shut off the FET at a predetermined voltage or current decay rate.

4. The apparatus according to claim 1, wherein the current controller is arranged to start turn on of the IGBT after it starts turn on of the FET.

5. The apparatus according to claim 4, wherein the current controller is arranged to start turn on of the IGBT after the turn on of the FET has finished.

6. The apparatus according to claim 4, wherein the current controller is arranged to turn on the FET at a predetermined voltage or current increase rate.

7. The apparatus according to claim 1, further including an over-current controller for shutting off the IGBT and the FET when current greater than a predetermined threshold is detected.

8. The apparatus according to claim 1, wherein the FET is arranged in parallel with the IGBT, so as to minimise the voltage drop in the power supplied to the load.

9. The apparatus according to claim 1, further including a voltage clamp to prevent avalanche of the FET.

10. A method of operating a solid state power control apparatus, the apparatus including:
an IGBT and a FET, for supplying current to a load, and
a CLD or SiC JFET operable by a current controller to reduce current flow prior to shut off, the method comprising:
  starting shut off of the IGBT before starting shut off of the FET; and
  reducing current flow prior to start of the turn off of the IGBT and the FET.

11. The method according to claim 10, wherein the shut off of the FET starts after the shut off of the IGBT has finished.

12. The method according to claim 10, wherein the shut off of the FET is carried out at a predetermined voltage or current decay rate.

13. The method according to claim 10, including the steps of starting to turn on the IGBT after starting turn on of the FET.

14. The method according to claim 13, wherein the turn on of the IGBT starts after the turn on of the FET has finished.

15. The method according to claim 13, wherein the turn on of the FET is carried out at a predetermined voltage or current increase rate.

16. The method according to claim 10, further including shutting off the IGBT and the FET when current greater than a predetermined threshold is detected.

* * * * *